(12) United States Patent
Agrawal et al.

(10) Patent No.: US 11,476,859 B1
(45) Date of Patent: Oct. 18, 2022

(54) COMPENSATED DIGITAL-TO-ANALOG CONVERTER (DAC)

(71) Applicant: TEXAS INSTRUMENTS INCORPORATED, Dallas, TX (US)

(72) Inventors: Meghna Agrawal, Bengaluru (IN); Debapriya Sahu, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/335,667

(22) Filed: Jun. 1, 2021

(30) Foreign Application Priority Data

Mar. 18, 2021 (IN) .............................. 202141011640

(51) Int. Cl.
*H03M 1/06* (2006.01)
*H03M 3/00* (2006.01)

(52) U.S. Cl.
CPC ......... *H03M 1/0617* (2013.01); *H03M 3/464* (2013.01)

(58) Field of Classification Search
CPC ............................. H03M 1/0617; H03M 3/464
USPC ........................................ 341/118, 144, 143
See application file for complete search history.

(56) References Cited

U.S. PATENT DOCUMENTS

| 9,853,653 | B2 | 12/2017 | Kao | |
|---|---|---|---|---|
| 2005/0052298 | A1* | 3/2005 | Moon | H03M 1/687 341/135 |
| 2007/0159228 | A1* | 7/2007 | Nguyen | H03H 11/53 327/308 |
| 2010/0329157 | A1* | 12/2010 | Xing | H03F 1/3211 370/278 |

OTHER PUBLICATIONS

International Search Report for PCT/US2022/020680 dated Jun. 22, 2022.

* cited by examiner

*Primary Examiner* — Jean B Jeanglaude
(74) *Attorney, Agent, or Firm* — Valerie M. Davis; Charles A. Brill; Frank D. Cimino

(57) ABSTRACT

A circuit includes a digital-to-analog converter (DAC) and a compensation circuit. The DAC has a first terminal and a second terminal. The compensation circuit has a third terminal and a fourth terminal. The third terminal is coupled to the first terminal, and the fourth terminal is coupled to the second terminal. The compensation circuit is configured to source current into the first terminal responsive to an increase in voltage on the second terminal, and to sink current from the first terminal responsive to a decrease in voltage on the second terminal.

20 Claims, 4 Drawing Sheets

COMPENSATED DIGITAL-TO-ANALOG CONVERTER (DAC)

CROSS-REFERENCE TO RELATED APPLICATION

This application claims priority to India Provisional Application 202141011640, filed Mar. 18, 2021, titled "A Compensated Digital-to-Analog Converter (DAC)," which is hereby incorporated by reference in its entirety.

BACKGROUND

A digital-to-analog converter (DAC) converts a digital signal to an analog signal. A current steering DAC is one type of DAC, which includes a current source and two or more transistors. The control terminals of the transistors (e.g., their gates) are controlled by a digital input signal or its logical inverse. In response to one state of the digital input signal to the DAC, a first transistor is turned on to cause the current from the current source to flow to one output terminal of the current steering DAC. In response to another state of the digital input signal, another transistor is turned on to cause the current from the current source to flow to another output terminal of the current steering DAC. Current steering DACs may be used, for example, in sigma delta modulators which are used, for example, in analog-to-digital converters (ADCs).

SUMMARY

In one example, a circuit includes a digital-to-analog converter (DAC) and a compensation circuit. The DAC has a first terminal and a second terminal. The compensation circuit has a third terminal and a fourth terminal. The third terminal is coupled to the first terminal, and the fourth terminal is coupled to the second terminal. The compensation circuit is configured to source current into the first terminal responsive to an increase in voltage on the second terminal, and to sink current from the first terminal responsive to a decrease in voltage on the second terminal.

DETAILED DESCRIPTION

Figure 1:
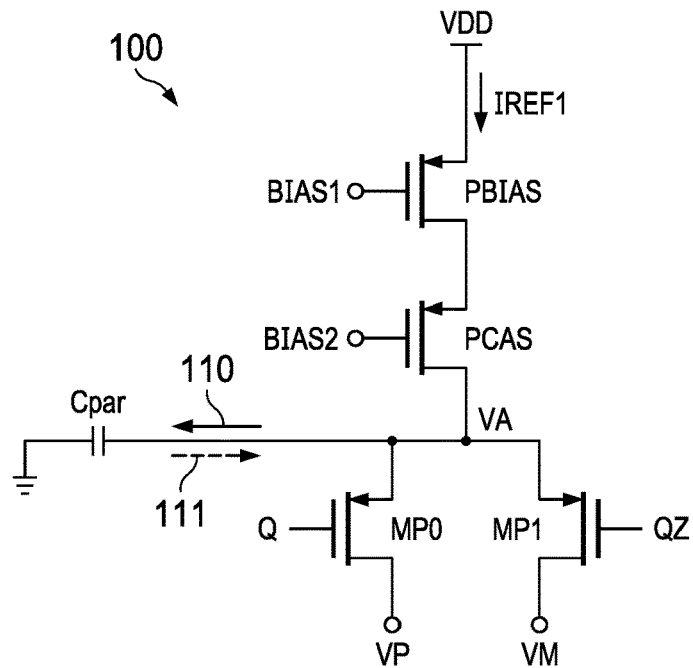
FIG. 1 shows an example implementation of a current steering DAC.

As described above, current steering DACs have transistors that "steer" current to one output terminal of the DAC or another output terminal of the DAC. Threshold voltage mismatch between the transistors and feedback effects from a Delta Sigma Modulator in which a current steering DAC may be used may undesirably introduce harmonics and noise. Such harmonics and noise may degrade the signal-to-noise ratio (SNR) and distort the output signal from, for example, a Sigma Delta analog-to-digital converter (ADC) in which the Sigma Delta Modulator is used. FIG. 1 is used to explain the problem of harmonics and noise.

FIG. 1 is an example of a current steering DAC 100. In this example, current steering DAC 100 includes transistors MP0, MP1, PCAS, and PBIAS. Transistor PBIAS is a P-type metal oxide semiconductor field effect transistor (PMOS transistor). A bias voltage BIAS1 is provided to the gate of the PBIAS transistor thereby causing the transistor PBIAS to produce a fixed reference current IREF1. The transistor PBIAS operates as a current source. The drain of the transistor PBIAS is coupled to the source of the transistor PCAS, which operates as a cascode transistor to increase the output resistance of the current source (the transistor PBIAS). A bias voltage BIAS2 is provided to the gate of the PCAS transistor.

The drain of the transistor PCAS is coupled to the sources of PMOS transistors MP0 and MP1 at a terminal labeled VA. The current steering DAC 100 is a single bit DAC whose single bit digital input is the digital input signal Q and its logical inverse QZ. Digital input signal Q is coupled to the gate of the MP0 transistor, and QZ is coupled to the gate of the transistor MP1. Terminals VP and VM are the output terminals of the current steering DAC. The drain of transistor MP0 is coupled to terminal VP, and the drain of transistor MP1 is coupled to terminal VM. The IREF1 reference current flows either through transistor MP0 to terminal VP or through transistor MP1 to terminal VM depending on the state of the digital input signal. If signal Q is low (and thus QZ is high), the IREF1 reference current flows through transistor MP0 to terminal VP. Conversely, if signal QZ is low (and thus Q is high), the IREF1 reference current flows through transistor MP1 to terminal VM. Terminals VP and VM are coupled to other components in a system such as a delta sigma modulator in which the current steering DAC 100 may be used. An example of a delta sigma modulator in which a current steering DAC is used is provided in FIG. 4 and is described below.

A capacitor Cpar is shown coupled between terminal VA and ground. Capacitor Cpar represents parasitic capacitances of capacitors MP0, MP1, and PCAS, as well as layout routing capacitances to/from terminal VA. For capacitors MP0 and MP1, capacitor Cpar represents the gate-to-source capacitance (CGS), the source-to-body capacitance (CSB), and the drain-to-source capacitance (CDS) of MP1 and MP0. For capacitor PCAS, capacitor Cpar represents the gate-to-drain capacitance (CGD), the drain-to-body capacitance (CDB), and the CDS.

In an ideal case (i.e., absence of parasitic capacitor Cpar), the total IREF1 current flows to either the VP or the VM terminal through the respective transistor MP0 or MP1. The voltage on terminal VA may increase or decrease each time a transition of the digital input occurs (e.g., Q changing from low to high, or from high to low). In some cases, transistors MP0 and MP1 are operated in the saturation region. If the threshold voltage of transistor MP0 is equal to the threshold voltage of transistor MP1, then the voltage on terminal VA remains at a fixed voltage and does not change during a digital input change of state of signals Q and QZ. However, due to manufacturing tolerances, there may be a difference between the threshold voltages of transistors MP0 and MP1. The threshold voltage difference causes a change in the voltage of terminal VA during a digital input change. For example, the voltage of terminal VA may increase or decrease by the amount of the threshold voltage difference between transistors MP0 and MP1, depending on which transistor's threshold voltage is higher or lower than that of the other transistor.

In some implementations, transistors MP0 and MP1 are operated in their linear region. In such implementations, during a data transition of Q and QZ (e.g., Q changing from a "0" to a "1" and QZ changing from a "1" to a "0"), the voltage on terminal VA increases to VP+VDS (where VDS is the drain-to-source voltage of the transistor MP0 or MP1 that is on. The magnitude of VDS may be on the order of 2-3 mV in some implementations. The voltage between terminals VP and VM have a signal swing along with some offset voltage. The offset voltage may be on the order of 10-20 mV in some implementations.

Due to the presence of parasitic capacitor Cpar, responsive to a sudden increase in the voltage of terminal VA, the voltage across capacitor Cpar increases and thus current flows from terminal VA to capacitor Cpar, as indicated by arrow 110. Conversely, responsive to a decrease in the voltage of terminal VA, the voltage across capacitor Cpar decreases and thus current flows from the capacitor Cpar to terminal VA, as indicated by arrow 111. In the scenario in which capacitor Cpar is charged (due to an increase in the voltage on terminal VA), a portion of the IREF1 current is provided to capacitor Cpar, Accordingly, when capacitor Cpar receives current from terminal VA, less than the full IREF1 current flows through whichever of transistor MP0 or MP1 is on. In the scenario in which capacitor Cpar is discharged (due to a decrease in the voltage on terminal VA), current sourced by capacitor Cpar is provided to terminal VA and is added to the IREF1 current from the transistor PBIAS. Accordingly, when capacitor Cpar sources current to terminal VA, more than the full IREF1 current flows through which ever of transistor MP0 or MP1 is on. In either case, during a transition of the digital signals Q and QZ to the gates of transistors MP0 and MP1, the current through MP0 or MP1 (whichever transistor is on) temporarily deviates from the magnitude of IREF1. Upon the parasitic capacitor Cpar being fully charged or discharged, the current to (110) or from (111) capacitor Cpar falls to 0 A and the drain current through MP0 or MP1 returns to IREF1. The deviation of IREF1 up or down due the aforementioned data transitions unfortunately causes harmonics in the output current from the current steering DAC (the current through transistors MP0, MP1), and increases the noise floor due to noise folding.

Figure 2:
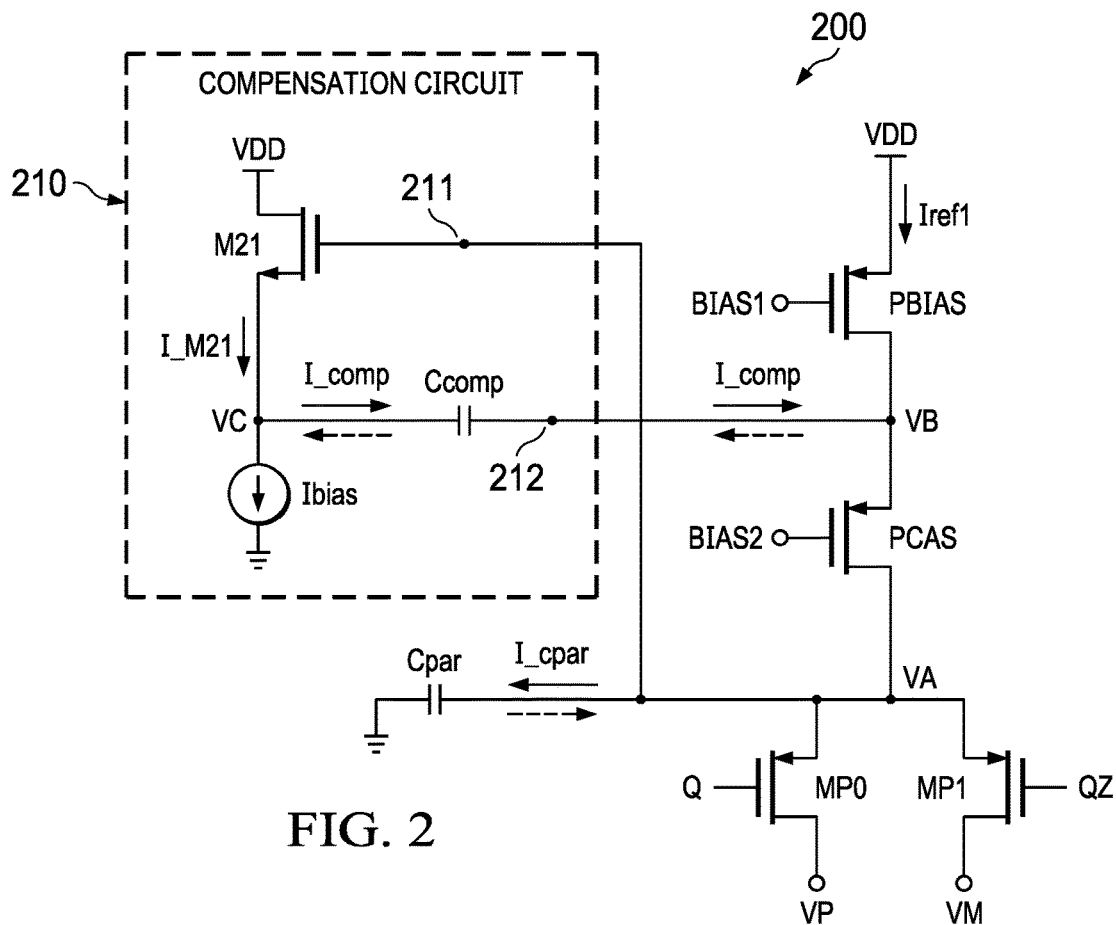
FIG. 2 shows an example implementation of a compensated current steering DAC which includes P-type metal oxide semiconductor field effect transistors.

FIG. 2 shows an example of a compensated current steering DAC 200 that reduces or eliminates the harmonics and noise floor problems explained above through the use of a compensation circuit 210. The compensation circuit 210 ensures that the current through MP0 or MP1 is approximately equal to IREF1 despite extra current flow to or from capacitor Cpar. The compensation circuit 210 includes a transistor M21, a compensation capacitor Ccomp, and a bias current circuit Ibias ("Ibias" refers both to the bias current circuit and the current it produces). In this example, the transistor M21 is an N-type metal oxide semiconductor field effect transistor (NMOS transistor). The drain of transistor M21 is coupled to a supply voltage terminal, and the source of transistor M21 is coupled to the compensation capacitor Ccomp and to the bias current source circuit Ibias at terminal VC. The drain current through transistor M21 is designated as I_M21. The current through the compensation capacitor Ccomp is designated as I_comp. The current through the parasitic capacitor Cpar is designated as I_cpar. Current I_cpar and I_comp are shown as a solid arrow in one direction and a dashed arrow in the opposite direction. The solid arrows represent the direction of current I_cpar and I_comp responsive to an increase in voltage on terminal VA (and capacitor Cpar charges), whereas the dashed arrows represent the direction of current I_cpar and I_comp responsive to a decrease in voltage on terminal VA (and capacitor Cpar discharges).

The gate of transistor M21 provides a first terminal 211 of the compensation circuit 210. The compensation capacitor Ccomp provides a second terminal 212 (opposite the capacitor terminal coupled to the source of transistor M21) of the compensation circuit 210. Compensation circuit terminal 211 is coupled to terminal VA. The compensation capacitor Ccomp (and thus terminal 212) of the compensation circuit is coupled to the connection point between transistors PBIAS and PCAS (a terminal labeled VB in FIG. 2).

If the voltage on terminal VA increases, current I_cpar flows from terminal VA to the parasitic capacitor Cpar thereby charging up the parasitic capacitor. The direction of current flow of I_cpar to the parasitic capacitor Cpar is represented as the solid arrow. The increase in voltage on terminal VA also increases the gate-to-source voltage (Vgs) of transistor M21. The increase in Vgs of transistor M21 causes an increase in the drain current through transistor M1 (I_M21). As current I_M21 increases, because Ibias is a fixed current, that portion of current I_M21 in excess of Ibias flows through the compensation capacitor Ccomp as I_comp (solid arrow) and into terminal VB. Accordingly, an increase in the voltage on terminal VA causes current I_cpar to flow from terminal VA to the parasitic capacitor Cpar, and an approximately equal magnitude current Icomp to flow from the compensation capacitor Ccomp into terminal VB. The net effect of current I_cpar leaving terminal VA and an approximately equal magnitude current Icomp entering terminal VB is that the current through whichever of transistors MP0 or MP1 is on is approximately equal to Iref1 even during a transition of digital input signals Q and QZ to the compensated current steering DAC 200.

If the voltage on terminal VA decreases, current I_cpar flows from parasitic capacitor Cpar to terminal VA (dashed arrow) thereby discharging the parasitic capacitor. The decrease in voltage on terminal VA also decreases the Vgs of transistor M21. The decrease in Vgs of transistor M21 causes a decrease in the current I_M21 through transistor. As current I_M21 decreases below the magnitude of fixed current Ibas, I_comp current (dashed arrow) flows from terminal VB through capacitor Comp to terminal VC so that the sum of I_M21 and I_comp is approximately equal to Ibias. Accordingly, a decrease in the voltage on terminal VA causes current I_cpar to flow from parasitic capacitor Cpar to terminal VA, and an approximately equal magnitude current I_comp flows from terminal VB to the compensation capacitor Ccomp. The net effect of current I_cpar flowing into terminal VA and an approximately equal magnitude current Icomp flowing out of terminal VB is that the current through whichever of transistors MP0 or MP1 is on is approximately equal to Iref1 even during a transition of digital input signal Q and QZ to the compensated current steering DAC 200.

The compensation circuit 210 has a common drain type of configuration. The voltage gain of this configuration is ideally 1 but may be slightly little less than 1 (e.g., an amount a less than 1) as a practical matter. Current I_comp is made approximately equal to current I_cpar by making the capacitance of capacitor Ccomp equal to that of capacitor Cpar by the value a into account, that is, $\alpha*Ccomp=Cpar$. The current value of Ibias is chosen such that the amplifier has sufficient bandwidth, that is, the voltage of terminal VC is able to track the voltage of terminal VA.

As described above, the compensation circuit 210 responds to changes in voltage on terminal VA by sourcing current to, or sinking current from, terminal VB. The current to or from terminal VB by the compensation circuit 210 is a current that that is approximately equal in magnitude to the current that charges or discharges the parasitic capacitor Cpar, thereby causing the current through MP0 (or MP1) to be approximately equal to Iref1.

Figure 3:
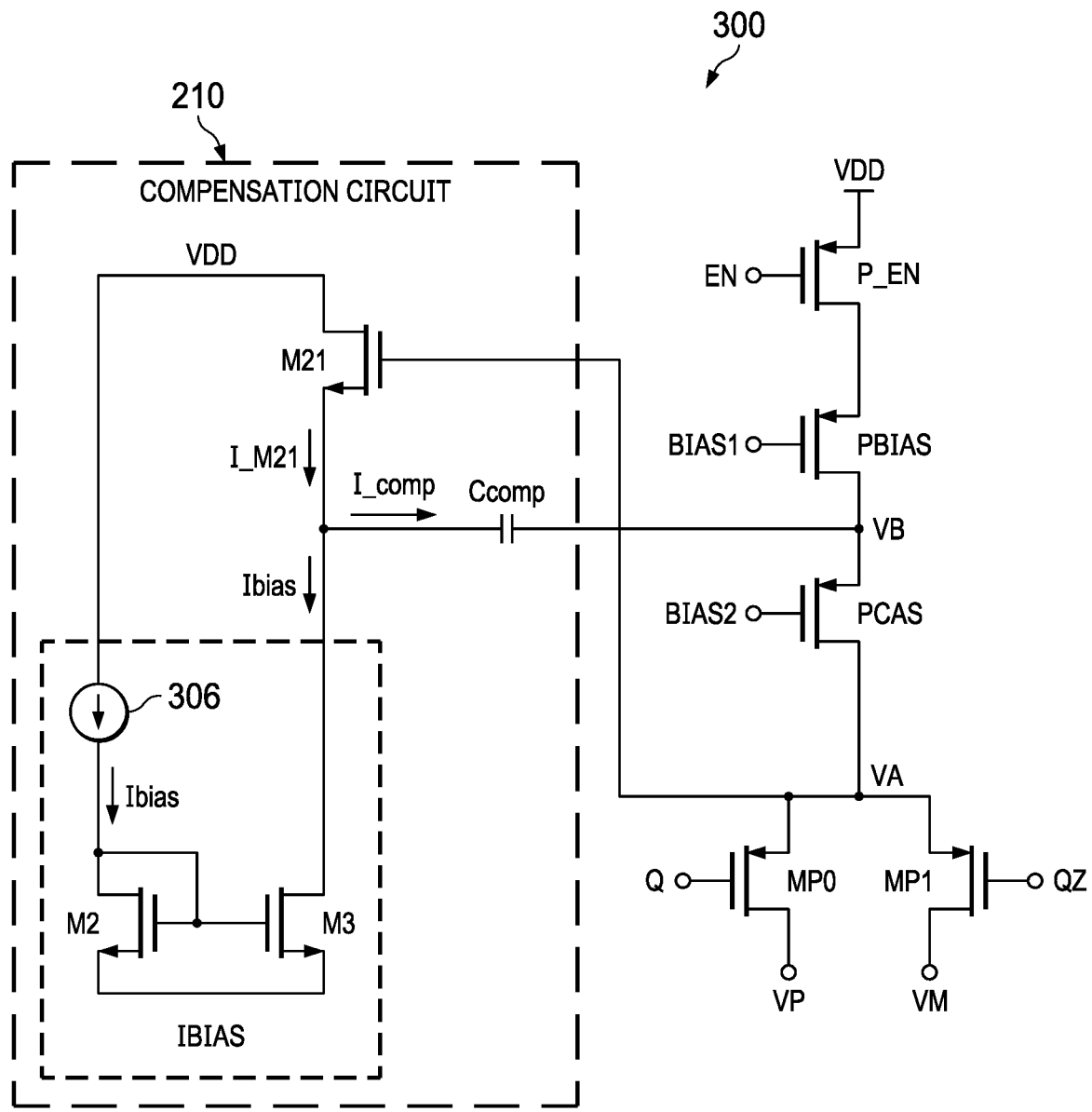
FIG. 3 shows an example implementation of the current steering DAC of FIG. 2 with additional detail.

FIG. 3 shows a compensated current steering DAC 300 similar to compensated current steering DAC 200 but with additional detail. The additional detail is the inclusion of an enable switch, P_EN, and an implementation of the bias current source circuit Ibias. The enable switch P_EN is a PMOS transistor in this example and couples between VDD and the PBIAS transistor. The signal to the gate of the enable switch P_EN is a signal called EN. The EN signal turns P_EN on and off. With P_EN in an off state, the compensated current steering DAC 300 is disabled, and with P_EN in an on state, the compensated current steering DAC 300 is enabled.

The bias current source circuit Ibias comprises a current source 306 coupled to a current mirror formed by NMOS transistors M2 and M3. Current source 306 produces the current Ibias which flows through transistor M2. In one example, the current ratio of the current mirror is 1:1 and thus the current through transistor M3 also is approximately Ibias as shown in FIG. 3.

The compensated current steering DACs described herein can be used as a standalone DAC or as part of a larger system such an ADC. Examples of ADCs that may use the described compensated current steering DACs include sigma delta ADCs, successive approximation register (SAR) ADCs, and pipeline ADCs. The current steering DAC described herein can also be used as part of a charge-pump.

Figure 4:
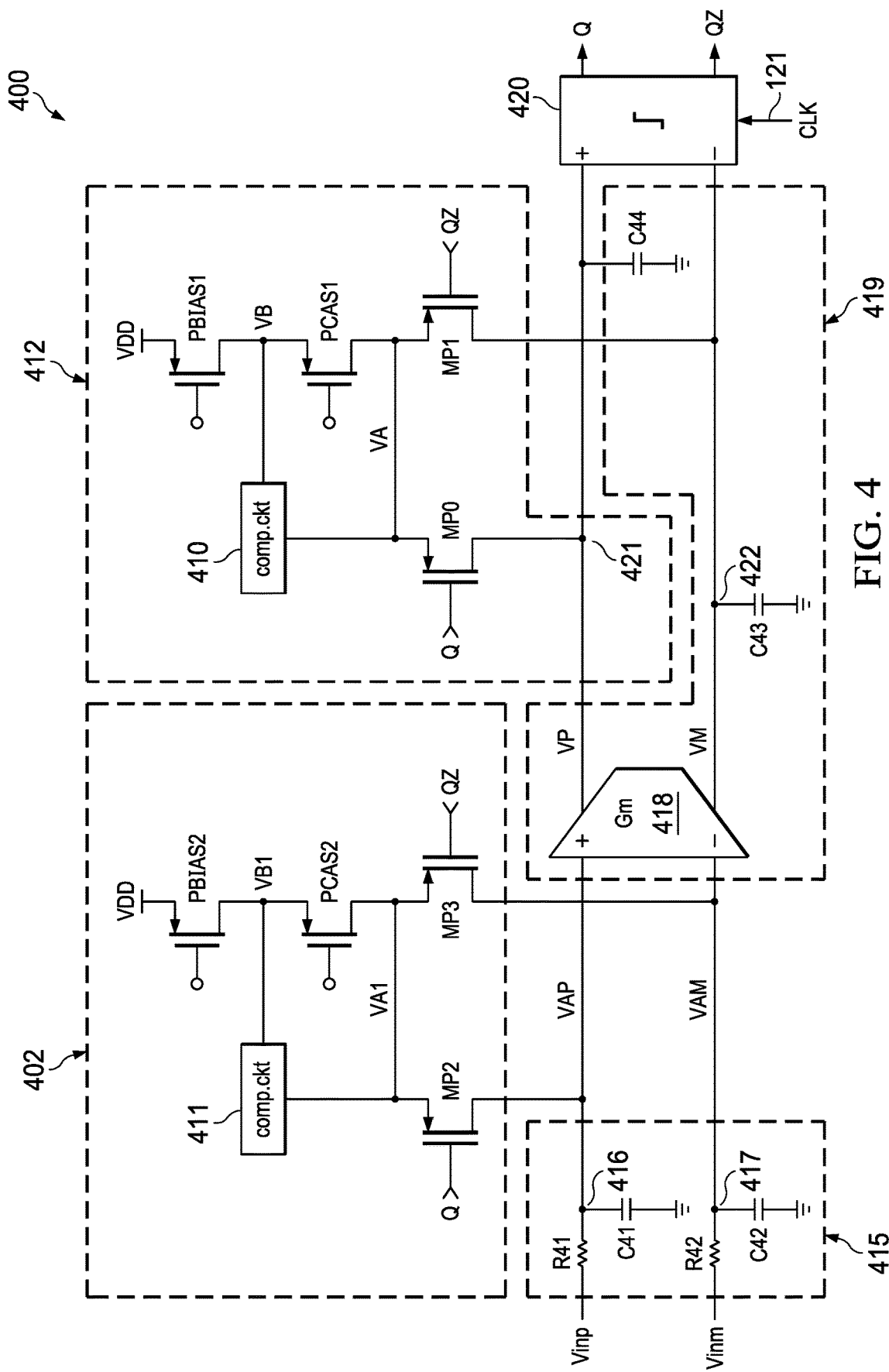
FIG. 4 shows an example of a second order, delta sigma modulator including multiple compensated current steering DACs, such as that shown in FIGS. 2, 3, and 5.

FIG. 4 shows an example implementation of a second order (although the ADC can be of any order) sigma delta modulator-based ADC 400. In the example of FIG. 4, the sigma delta modulator-based ADC includes integrators 415 and 419, comparator 420, and compensated current steering DACs 402 and 412. In one example, each of the compensated current steering DACs 402 and 412 is implemented as shown for the compensated current steering DACs 200 or 300 of FIGS. 2 and 3. Compensated current steering DAC 412 includes PBIAS1 and PCAS1 transistors, which represent the transistors PBIAS and PCAS described above. Transistors MP0 and MP1 from FIG. 2 are shown as well. A compensation circuit 410 within current steering DAC 412 connects to terminals VA and VB as described above. In one example, compensation circuit 410 is implemented as shown for compensation circuit 210 in FIG. 2 or 3. Similarly, compensated current steering DAC 402 includes transistors PBIAS2 and PCAS2 (connected together at terminal VB1), which represent the transistors PBIAS and PCAS described above. Transistors MP0 and MP1 of FIGS. 2 and 3 are shown as transistors MP2 and MP3 of DAC 402, respectively, and their sources are connected together at terminal VA1. A compensation circuit 411 within current steering DAC 402 connects to terminals VA1 and VB1 as described above. In an example, compensation circuit 411 is implemented as shown for compensation circuit 210 in FIG. 2 or 3.

The analog input signal to the sigma delta modulator-based ADC 400 is encoded as the difference in voltage between input voltages VINP and VINM. The integrator 415 includes two resistor-capacitor pairs R41/C41 and R42/C42. Voltage VINP is provided to its respective resistor R41, and voltage VINM is provided to its resistor R42. Resistor R41 is connected to a respective capacitor C41 at terminal 216 as shown, and resistor R42 is connected to a respective capacitor C42 at terminal 417. The voltage on terminal 416 is designated VAP (and terminal 416 is also referred to as the VAP terminal 416), and the voltage on terminal 417 is designated VAM (and terminal 417 is also referred to as the VAM terminal 417). The drain of transistor MP2 of the compensated current steering DAC 402 is coupled to terminal VAP, and the drain of transistor MP3 of the compensated current steering DAC 402 is coupled to terminal VAM. For compensated current steering DAC 402, VAP terminal 416 and VAM terminal 417 are the VP and VM terminals, respectively, of FIG. 2.

Integrator 419 includes a transconductance amplifier (Gm) 418 and capacitors C43 and C44. The positive input of Gm 418 is coupled to resistor R41 and capacitor C41 at the VAP terminal 416 The negative input of Gm 418 is coupled to resistor R42 and capacitor C42 at the VAM terminal 417. In this example, resistors R41 and R42 have the same resistance and capacitors C41 and C42 have the same capacitance. Accordingly, the voltage on the VAP terminal 416 is provided to the positive input of the Gm 418, and voltage on the VAM terminal 417 is provided to the negative input of the Gm 418. The positive output of the Gm 418 is coupled to a positive input of comparator 420 at terminal 421, and the negative output of Gm 418 is coupled to a negative input of comparator 420 at terminal 422.

Capacitor C43 is coupled between terminal 422 and ground as shown. Similarly, capacitor C44 is coupled between terminal 421 and ground. Capacitors C43 and C44 have the same capacitance in this example. Current from Gm 418 as well as current from compensated current steering DAC 402 charge capacitors C44 and C43 thereby forming a differential voltage across the VP and VM terminals 421 and 422. Comparator 420 outputs the digital signals Q and its logical inverse, QZ, described above. Q is asserted high (and QZ is asserted low) by comparator 420 responsive to the voltage on the VP terminal 421 being higher than the voltage on the VM terminal 422. Q is forced high (and QZ is forced high) by comparator 420 responsive to the voltage on the VP terminal 421 being lower than the voltage on the VM terminal 422. The Q signal is connected to the gates of transistors MP0 and MP2, and the QZ signal is connected to the gates of transistors MP1 and MP3. clock signal (CLK) is used to cause the comparator 420 to sample the input on the VP and VM terminals 421 and 422. The drain of transistor MP0 of the compensated current steering DAC 412 is connected to the VP terminal 421, and the drain of transistor MP1 is connected to the VM terminal 422. For compensated current steering DAC 412, VP terminal 421 and VM terminal 422 are the VP and VM terminals, respectively, of FIG. 2.

Compensated current steering DACs 402 and 412 inject current into the VAP and VP terminals 416 and 421, respectively, responsive to the Q signal being low, which turns on transistors MP2 and MP0. Conversely, compensated current steering DACs 402 and 412 inject current into the VAM and VM terminals 417 and 422, respectively, responsive to the QZ signal being low, which turns on transistors MP3 and MP1. Compensation circuit 411 sources current into or sinks current from terminal VB1 responsive to a change in voltage on terminal VA1, as described above. Similarly, compensation circuit 410 sources current into or sinks current from terminal VB responsive to a change in voltage on terminal VA.

The signal-to-noise ratio (SNR) of a current steering DAC can be increased through the inclusion of a compensation circuit (e.g., compensation circuit 210). Table I below illustrates the SNR of a Sigma-Delta ADC having a current steering DAC without the described compensation circuit (e.g., current steering DAC 100 of FIG. 1) and with the described compensation circuit (e.g., compensated current steering DAC 200 (FIG. 2). The SNR values are provided for various offset voltages. The offset voltage represents the change in the voltage on the VA terminal during a data transition. At 0 mV of offset, there is little or no difference in the SNR between the two types of current steering DACs. However, the SNR of a Sigma-Delta ADC having a compensated current steering DAC is higher than for a Sigma-Delta ADC having a non-compensated current steering DAC for offset voltages of 20 mV, 40 mV, and 60 mV. For example, the SNR for the current steering DAC without compensation is 58 dB when no offset voltage is present, but reduces to 43.2 dB in the presence of 40 mV of offset, but through the use of a compensation circuit such as that described herein, the SNR is 55.5 dB with 40 mV of offset.

TABLE I

| Offset | SNR without compensation | SNR with compensation |
|---|---|---|
| 0 mV | 58 dB | 57.7 dB |
| 20 mV | 47.7 dB | 56.1 dB |
| 40 mV | 43.2 dB | 55.5 dB |
| 60 mV | 40.1 dB | 51.5 dB |

Figure 5:
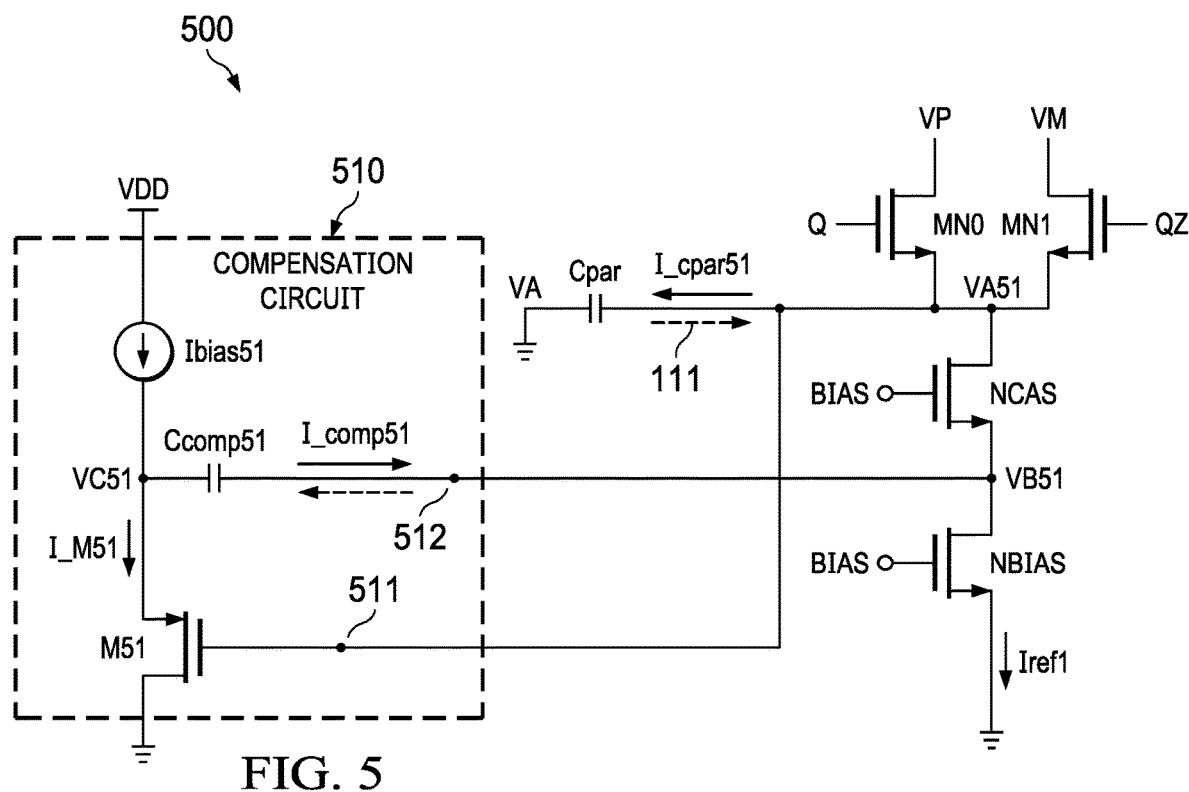
FIG. 5 shows an example implementation of a compensated current steering DAC which includes N-type metal oxide semiconductor field effect transistors.

Whereas the compensated current steering DAC of FIGS. 2 and 3 include PMOS transistors, the compensation circuit described herein can be used with an NMOS transistor-based current steering DAC. FIG. 5 shows an example of a compensated current steering DAC 500 that includes NMOS transistors. The compensated current steering DAC 500 includes NMOS transistors MN0, MN1, NCAS, and NBIAS as well a compensation circuit 510. The compensation circuit 510 includes a transistor M51, a compensation capacitor Ccomp51, and a bias current circuit Ibias51 ("Ibias51" refers both to the bias current circuit and the current it produces). In this example, the transistor M51 is PMOS transistor. The drain of transistor M51 is coupled to ground, and the source of transistor M51 is coupled to the compensation capacitor Ccomp51 and to the bias current source circuit Ibias51 at terminal VC51. The drain current through transistor M51 is designated as I_M51. The current through the compensation capacitor Ccomp is designated as l_comp51. The current through the parasitic capacitor Cpar is designated as I_cpar51.

The gate of transistor M51 provides a first terminal 511 of the compensation circuit 510. The compensation capacitor Ccomp51 provides a second terminal 512 (opposite the capacitor terminal coupled to the source of transistor M51) of the compensation circuit 210. Compensation circuit terminal 511 is coupled to terminal VA51. The compensation capacitor Ccomp51 (and thus terminal 512) of the compensation circuit is coupled to the connection point between transistors NBIAS and NCAS (a terminal labeled VB51 in FIG. 5).

If the voltage on terminal VA51 increases, current I_cpar51 (solid arrow) flows from terminal VA51 to the parasitic capacitor Cpar thereby charging up the parasitic capacitor Cpar. The increase in voltage on terminal VA51 also decreases the Vgs of transistor M51. The decrease in Vgs of transistor M51 causes a decrease in the drain current through transistor M51 (I_M51). With the decrease in current I_M51, because Ibias51 is a fixed current, that portion of Ibias51 in excess of I_M51 flows through the compensation capacitor Ccomp into terminal VB51 as current I_comp51 (solid arrow). Accordingly, an increase in the voltage on terminal VA51 causes current I_cpar51 to flow from terminal VA51 to the parasitic capacitor Cpar, and an approximately equal magnitude current Icomp51 to flow from the compensation capacitor Ccomp into terminal VB51.

If the voltage on terminal VA51 decreases, current I_cpar flows from parasitic capacitor Cpar to terminal VA (dashed arrow) thereby discharging the parasitic capacitor Cpar. The decrease in voltage on terminal VA51 also increases the Vgs of transistor M51. The increase in Vgs of transistor M51 causes an increase in the current I_M51 through transistor M51. As current I_M51 increases above the magnitude of fixed current Ibias51, I_comp51 current (dashed arrow) flows from terminal VB51 through capacitor Ccomp51 to terminal VC51 so that the sum of I_M51 and I_comp51 is approximately equal to Ibias51. Accordingly, a decrease in the voltage on terminal VA51 causes current I_cpar51 to flow from parasitic capacitor Cpar to terminal VA51, and an approximately equal magnitude current I_comp51 flows from terminal VB51 to the compensation capacitor Ccomp51.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A Modifications are possible in the described embodiments, and other embodiments are possible, within the scope of the claims.

What is claimed is:

1. A circuit, comprising:
    a digital-to-analog converter (DAC), the DAC having a first terminal and a second terminal; and
    a compensation circuit having a third terminal and a fourth terminal, the third terminal is coupled to the first terminal, and the fourth terminal is coupled to the second terminal, the compensation circuit is configured to source current into the first terminal responsive to an increase in voltage on the second terminal, and to sink current from the first terminal responsive to a decrease in voltage on the second terminal.

2. The circuit of claim 1, wherein the compensation circuit comprises:
    a transistor having a gate, a drain, and a source, the gate is the fourth terminal; and
    a capacitor having a terminal coupled to the source, the capacitor having another terminal that is the third terminal.

3. The circuit of claim 2, wherein the compensation circuit further includes a current source circuit coupled to the source.

4. The circuit of claim 3, wherein the current source circuit is coupled between the source and one of ground or a supply voltage terminal.

5. The circuit of claim 1, wherein the DAC is a current steering DAC.

6. The circuit of claim 1, wherein the DAC is a current steering, single bit DAC.

7. The circuit of claim 6, wherein the DAC includes:
a first transistor coupled to a second transistor at the second terminal; and
a third transistor configured to provide a bias current; and
a fourth transistor coupled to the third transistor at the first terminal, and the fourth transistor is coupled to the first and second transistors at the second terminal.

8. A current steering digital-to-analog converter (DAC), comprising:
a first transistor;
a second transistor;
a bias current transistor having a first terminal;
a third transistor coupled to the first terminal, the third transistor having a second terminal coupled to the first and second transistors; and
a compensation circuit having a third terminal and a fourth terminal, the third terminal coupled to the first terminal, and the fourth terminal coupled to the second terminal, the compensation circuit configured to source current into the first terminal responsive to an increase in voltage on the second terminal, and to sink current from the first terminal responsive to a decrease in voltage on the second terminal.

9. The circuit of claim 8, wherein the compensation circuit comprises:
a metal oxide semiconductor field effect transistor (MOSFET) having a gate, a drain, and a source, the gate is the fourth terminal; and
a capacitor having a terminal coupled to the source, the capacitor having another terminal that is the third terminal.

10. The circuit of claim 9, wherein the compensation circuit further includes a current circuit coupled to the source.

11. The circuit of claim 10, wherein the current source circuit is coupled between the source and one of ground or a supply voltage terminal.

12. The circuit of claim 8, wherein the compensation circuit comprises:
a current source circuit; and
a capacitor having a terminal coupled to the current source circuit, the capacitor having another terminal that is the third terminal.

13. The circuit of claim 8, wherein the third transistor is a cascode transistor.

14. A circuit, comprising:
a sigma delta modulator-based analog-to-digital converter (ADC) having a first ADC terminal and a second ADC terminal;
a digital-to-analog converter (DAC) having first, second, third, and fourth DAC terminals, the first DAC terminal is coupled to the first ADC terminal, and the second DAC terminal is coupled to the second ADC terminal; and
a compensation circuit having a first compensation circuit terminal and a second compensation circuit terminal, the first compensation circuit terminal is coupled to the third DAC terminal, and the second compensation circuit terminal is coupled to the fourth DAC terminal, the compensation circuit is configured to source current into the third DAC terminal responsive to an increase in voltage on the fourth DAC terminal, and to sink current from the third DAC terminal responsive to a decrease in voltage on the fourth DAC terminal.

15. The circuit of claim 14, wherein the compensation circuit comprises:
a transistor having a gate, a drain, and a source, the gate is the second compensation circuit terminal; and
a capacitor having a terminal coupled to the source, the capacitor having another terminal that is the first compensation circuit terminal.

16. The circuit of claim 14, wherein the compensation circuit further includes a current circuit coupled to the source.

17. The circuit of claim 14, wherein the DAC is a current steering DAC.

18. The circuit of claim 14, wherein the DAC is a current steering, single bit DAC.

19. The circuit of claim 14, wherein the DAC is a first DAC and the compensation circuit is a first compensation circuit, and further comprising:
a second DAC having a fifth, sixth, seventh, and eighth DAC terminals, the fifth DAC terminal is coupled to a third ADC terminal, and the sixth DAC terminal is coupled to a fourth ADC terminal; and
a second compensation circuit having a third compensation circuit terminal and a fourth compensation circuit terminal, the third compensation circuit terminal is coupled to the seventh DAC terminal, and the fourth compensation circuit terminal is coupled to the eighth DAC terminal.

20. The circuit of claim 19, wherein the second compensation circuit is configured to source current into the seventh DAC terminal responsive to an increase in voltage on the eighth DAC terminal, and to sink current from the seventh DAC terminal responsive to a decrease in voltage on the eighth DAC terminal.

* * * * *